US012690432B2

(12) United States Patent
Endo et al.

(10) Patent No.: US 12,690,432 B2
(45) Date of Patent: Jul. 21, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kiyoshi Endo, Tokyo (JP); Takashi Moriyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 388 days.

(21) Appl. No.: 18/482,445

(22) Filed: Oct. 6, 2023

(65) Prior Publication Data

US 2024/0162080 A1 May 16, 2024

(30) Foreign Application Priority Data

Nov. 16, 2022 (JP) ................................. 2022-183551

(51) Int. Cl.
| | |
|---|---|
| *H01L 21/28* | (2025.01) |
| *H10D 64/01* | (2025.01) |
| *H10W 10/00* | (2026.01) |
| *H10W 10/17* | (2026.01) |
| *H10W 20/00* | (2026.01) |

(52) U.S. Cl.
CPC .... *H10W 10/014* (2026.01); *H10D 64/01334* (2026.01); *H10D 64/017* (2025.01); *H10W 10/17* (2026.01); *H10W 20/077* (2026.01)

(58) Field of Classification Search
CPC ......... H01L 21/28141; H01L 21/76224; H01L 21/76834; H10D 64/017
See application file for complete search history.

(56) References Cited

U.S. PATENT DOCUMENTS

| | | | |
|---|---|---|---|
| 7,528,033 B2 * | 5/2009 | Kim .................. | H10W 10/0145 |
| | | | 438/296 |
| 9,318,500 B2 | 4/2016 | Shinohara | |
| 11,545,447 B2 * | 1/2023 | Chang ...................... | H10D 1/47 |
| 2006/0163665 A1 * | 7/2006 | Chuang .............. | H10D 84/0151 |
| | | | 257/E21.628 |

FOREIGN PATENT DOCUMENTS

JP 2014-154789 A 8/2014

* cited by examiner

*Primary Examiner* — Jaehwan Oh
(74) *Attorney, Agent, or Firm* — Rimon P.C.

(57) ABSTRACT

A semiconductor device includes a first element disposed in a first region and including a high-dielectric-constant insulating film, a second element disposed in a second region, and an element isolation portion disposed between the first region and the second region and electrically isolating between the first element and the second element. A step portion is formed on the surface of the element isolation portion. The semiconductor device further includes a dummy pattern that straddles the step portion. The dummy pattern includes a first high-dielectric-constant insulating film and a conductive film covering the upper surface of the first high-dielectric-constant insulating film. The first high-dielectric-constant insulating film is exposed from both side surfaces of the dummy pattern. The semiconductor device further includes a sidewall insulating film covering the first high-dielectric-constant insulating film exposed from both side surfaces of the dummy pattern.

10 Claims, 11 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2022-183551 filed on Nov. 16, 2022, including the specification, drawings and abstract is incorporated herein by reference in its entirety.

BACKGROUND

The present disclosure relates to a semiconductor device and a method of manufacturing the same.

There are disclosed technique listed below.

[Patent Document 1] Japanese Unexamined Patent Application Publication No. 2014-154789

Patent Document 1 discloses a semiconductor device including a memory cell region, a peripheral circuit region where a MISFET (Metal Insulator Semiconductor Field Effect Transistor) is formed, and an element isolation region formed between the memory cell region and the peripheral circuit region. The MISFET includes a high-dielectric-constant (High-k) insulating film for a gate insulating film and a conductive film for a gate electrode.

In the manufacturing method of the semiconductor device described in Patent Document 1, a memory gate electrode is formed in the memory cell region, and an insulating film covering the memory gate electrode is formed so as to be continuous from the memory cell region to a part of the element isolation region. As a result, a step portion caused by the insulating film is formed on the element isolation region. Thereafter, a high-dielectric-constant insulating film and a conductive film are formed over the peripheral circuit region, the element isolation region having the step portion, and the memory cell region, and then patterned. As a result, a residual portion including the high-dielectric-constant insulating film and the conductive film is formed on a side surface of the step portion.

SUMMARY

The residual portion has an upper surface and a side surface, and the high-dielectric-constant insulating film appears on the upper surface and the side surface of the residual portion. Therefore, in the manufacturing method of the semiconductor device, at the time of performing processes in a state where the upper surface and the side surface of the residual portion are exposed, a part of the material configuring the high-dielectric-constant insulating film may detach and re-adhere to an unintended location such as another region of the semiconductor device or in the manufacturing apparatus.

Other objects and novel features will become apparent from the description of this specification and the accompanying drawings.

According to the present disclosure, a semiconductor device includes: a first element disposed in a first region and including a first high-dielectric-constant insulating film; a second element disposed in a second region; and an element isolation portion disposed between the first region and the second region and electrically isolating between the first element and the second element. A step portion is formed on a surface of the element isolation portion. The semiconductor device further includes a dummy pattern straddling the step portion. The dummy pattern includes a first highdielectric-constant insulating film and a conductive film covering an upper surface of the first high-dielectric-constant insulating film. The first high-dielectric-constant insulating film is exposed from both side surfaces of the dummy pattern. The semiconductor device further includes a sidewall insulating film covering the first high-dielectric-constant insulating film exposed from the both side surfaces of the dummy pattern.

According to the present disclosure, in a manufacturing method of a semiconductor device, the semiconductor device includes: a first element including a first high-dielectric-constant insulating film disposed in a first region, a second element disposed in a second region, and an element isolation portion disposed between the first region and the second region and electrically isolating between the first element and the second element. The manufacturing method of the semiconductor device includes: preparing a semiconductor substrate having a main surface extending from the first region to the second region and an element isolation portion disposed on the main surface and having a step portion on a surface of the element isolation portion; forming a coating film covering an insulating film having high-dielectric-constant and an upper surface of the insulating film so as to cover the main surface and the element isolation portion; and partially removing the insulating film and the coating film to form a dummy pattern so as to straddle the step portion. The dummy pattern is formed to include a first high-dielectric-constant insulating film formed of the insulating film and a conductive film formed of the coating film. The manufacturing method of the semiconductor device further includes forming a sidewall insulating film covering the first high-dielectric-constant insulating film exposed from both side surfaces of the dummy pattern.

According to the present disclosure, it is possible to provide a semiconductor device in which re-adhesion of a material configuring a high-dielectric-constant insulating film to an unintended location is suppressed.

DETAILED DESCRIPTION

Figure 1:
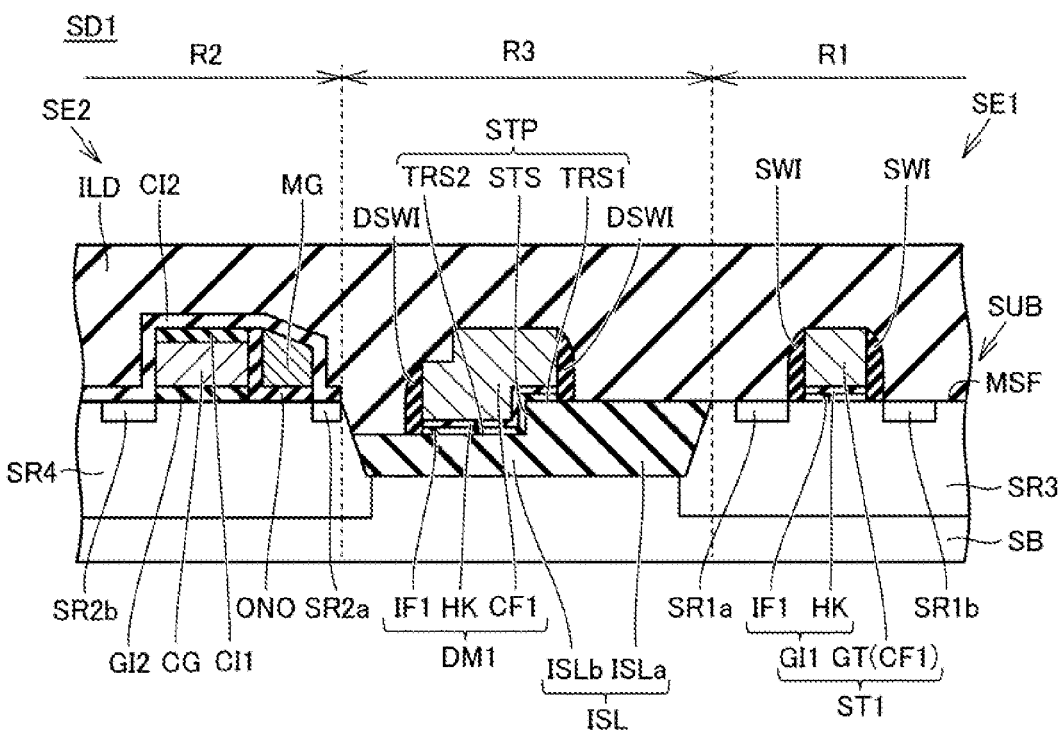
FIG. 1 is a cross-sectional view showing a semiconductor device according to a first embodiment.
Figure 2:
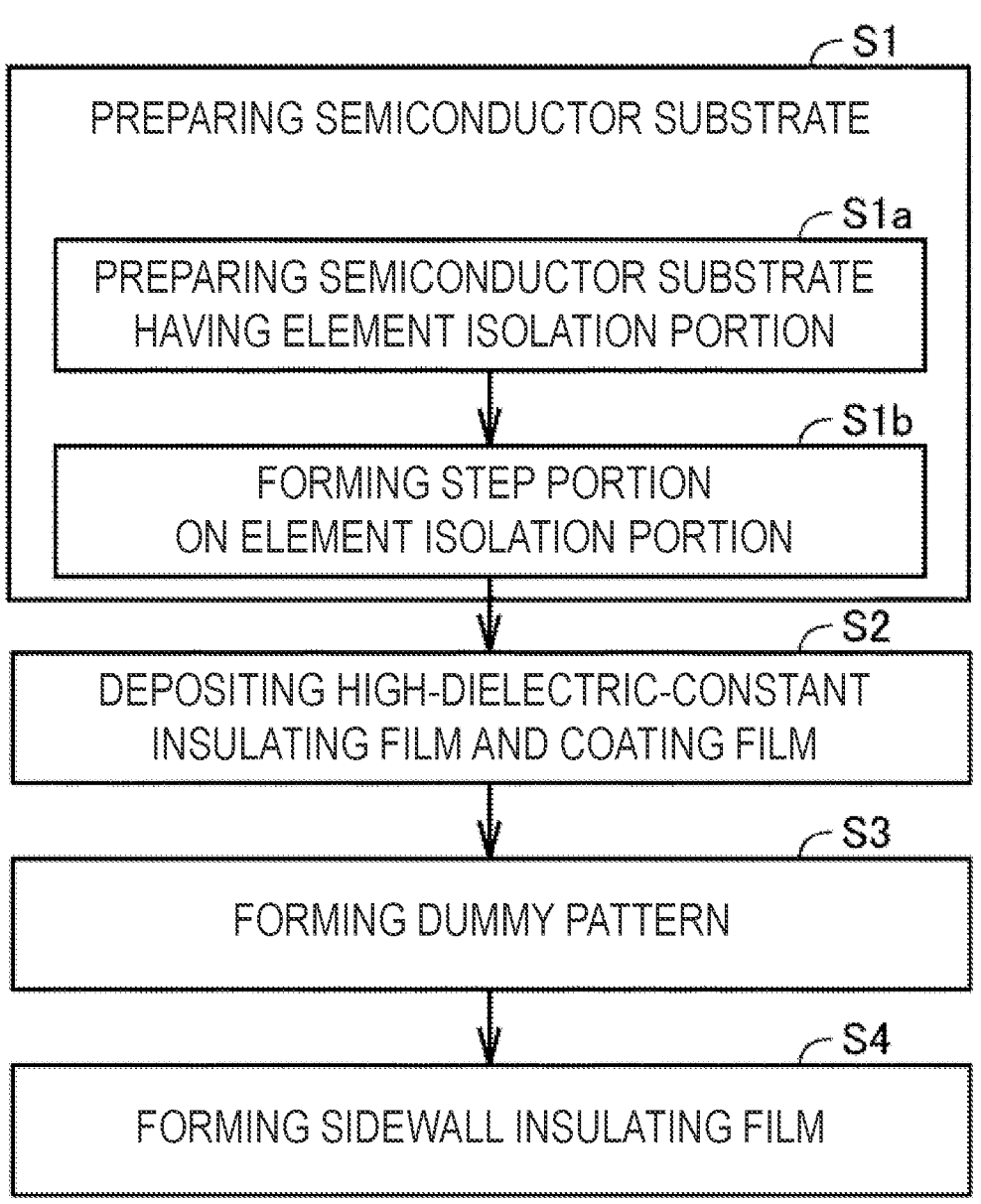
FIG. 2 is a flow chart of a manufacturing method of the semiconductor device according to the first embodiment.

Hereinafter, embodiments will be described with reference to the drawings. In the following drawings, the same or corresponding parts are denoted by the same reference numerals, and the description thereof will not be repeated.

First Embodiment

Configuration of Semiconductor Device According to First Embodiment

As shown in FIG. 1, a semiconductor device SD1 according to the first embodiment includes a first element SE1 included in a first region R1, a second element SE2 included in a second region R2, and an element isolation portion ISL included in an element isolation region R3.

As shown in FIG. 1, each of the first region R1, the second region R2, and the element isolation region R3 is a partial region of a semiconductor substrate SUB. A main surface MSF of the semiconductor substrate SUB extends from the first region R1 to the second region R2. The element isolation region R3 is disposed between the first region R1 and the second region R2 in a direction along the main surface MSF of the semiconductor substrate SUB.

The first element SE1 includes a high-dielectric-constant insulating film HK1 (first high-dielectric-constant insulating film). The first element SE1 may be any semiconductor element, but is, for example, a MISFET. The first element SE1 includes a sidewall insulating film SWI. The second element SE2 does not include the high-dielectric-constant insulating film HK. The second element SE2 may be any semiconductor element that does not include the high-dielectric-constant insulating film HK, but is, for example, a MONOS type memory element. The element isolation portion ISL electrically isolates between the first element SE1 and the second element SE2. The element isolation portion ISL is, for example, an STI (Shallow Trench Isolation).

As shown in FIG. 1, a step portion STP is formed on a surface of the element isolation portion ISL. The step portion STP has a step surface STS, a first terrace surface TRS1, and a second terrace surface TRS2. The first terrace surface TRS1 is located on a side of the first region R1 than the step surface STS. The first terrace surface TRS1 is located between the step surface STS and the first region R1. The second terrace surface TRS2 is located on a side of the second region R2 than the step surface STS. The second terrace surface TRS2 is located between the step surface STS and the second region R2. The second terrace surface TRS2 is connected to the first terrace surface TRS1 via the step surface STS. The step surface STS extends in a direction intersecting each of the first terrace surface TRS1 and the second terrace surface TRS2. The step surface STS is, for example, perpendicular to each of the first terrace surface TRS1 and the second terrace surface TRS2.

In the present specification, the "step portion STP formed on the surface of the element isolation portion ISL" means a step portion of which any of the step surface STS, the first terrace surface TRS1, or the second terrace surface TRS2 is configured by the surface of the element isolation portion ISL.

In the step portion STP of the semiconductor device SD1, each of the step surface STS, the first terrace surface TRS1, and the second terrace surface TRS2 is configured by the surface of the element isolation portion ISL. From a different viewpoint, the element isolation portion ISL has a thick portion ISLa in which the thickness of the insulating film embedded in the trench is relatively large, and a thin portion ISLb in which the thickness of the insulating film embedded in the trench is relatively small. In the semiconductor device SD1, the first terrace surface TRS1 is located above the second terrace surface TRS2. The first terrace surface TRS1 is a part of an upper surface of the thick portion ISLa. The second terrace surface TRS2 is a part of an upper surface of the thin portion ISLb. The step surface STS is a side surface of the thick portion ISLa. The second terrace surface TRS2 is lower than the main surface MSF of the semiconductor substrate SUB.

As shown in FIG. 1, the semiconductor device SD1 further includes a dummy pattern DM1 formed so as to straddle the step portion STP. The dummy pattern DM1 includes a first portion located on the thick portion ISLa of the element isolation portion ISL, and a second portion connected to the first portion and located on the thin portion ISLb of the element isolation portion ISL. In the semiconductor device SD1, the dummy pattern DM1 has the same configuration as a part of the first element SE1. In the manufacturing method of the semiconductor device SD1, the dummy pattern DM1 is formed at the same time in the step of forming a part of the first element SE1. In the semiconductor device SD1, the configuration of the dummy pattern DM1 is different from the configuration of the second element SE2. Similar to the first element SE1, the dummy pattern DM1 includes the high-dielectric-constant insulating film HK and the first conductive film CF1.

The material configuring the high-dielectric-constant insulating film HK may be any material having a dielectric constant higher than a dielectric constant of silicon nitride ($Si_3N_4$). The dielectric constant of the material configuring the high-dielectric-constant insulating film HK is 8.0 or more. Preferably, the material configuring the high-dielectric-constant insulating film HK is a so-called High-k material. Preferably, the high-dielectric-constant insulating film HK includes a first metal. Preferably, the first metal includes at least one selected from the group consisting of hafnium (Hf), zirconium (Zr), tantalum (Ta), aluminum (Al), and yttrium (Y). Preferably, the material configuring the high-dielectric-constant insulating film HK includes at least one selected from the group consisting of hafnium oxide ($HfO_2$), zirconium oxide ($ZrO_2$), tantalum oxide ($Ta_2O_5$), HfAlON, and yttrium oxide ($Y_2O_3$). The high-dielectric-constant insulating film HK may include a fine metal particle dispersed in or on the surface of the high-dielectric-constant insulating film HK and configured by a second metal different from the first metal. The latter configuration will be described later in a third embodiment.

Only the first conductive film CF1 is exposed on the upper surface of the dummy pattern DM1. The first conductive film CF1 covers the upper surface of the high-dielectric-constant insulating film HK. In the dummy pattern DM1, the high-dielectric-constant insulating film HK is exposed from both side surfaces facing away from each other. The high-dielectric-constant insulating film HK is exposed on the side surface of the dummy pattern DM1, and is not exposed on the upper surface of the dummy pattern DM1.

As shown in FIG. 1, the semiconductor device SD1 further includes a sidewall insulating film DSWI covering the high-dielectric-constant insulating film HK exposed from both side surfaces of the dummy pattern DM1. The sidewall insulating film DWSI is in contact with the high-dielectric-constant insulating film HK exposed from both side surfaces of the dummy pattern DM1. The sidewall insulating film DSWI preferably covers the entire side surface of the dummy pattern DM1 as long as the sidewall insulating film DSWI covers at least the high-dielectric-constant insulating film HK of the dummy pattern DM1. The high-dielectric-constant insulating film HK is in contact with the first conductive film CF1, a first insulating film IF1 described later, and the sidewall insulating film DWSI, and is not in contact with an interlayer insulating film ILD described later.

The material configuring the sidewall insulating film DSWI is the same as the material configuring the sidewall insulating film SWI included in the first element SE1, and includes, for example, at least one of silicon oxide ($SiO_2$) and silicon silicide ($Si_2N_4$).

Each of the sidewall insulating film SWI and the sidewall insulating film DSWI may be a laminated film of $SiO_2$ film and $Si_3N_4$ film.

The interlayer insulating film ILD is formed in the first region R1, the second region R2, and the element isolation region R3 of the semiconductor device SD1. The interlayer insulating film ILD is embedded around the first element SE1, the second element SE2, the dummy pattern DM1, and the sidewall insulating film DSWI. The material configuring the interlayer insulating film ILD is, for example, $SiO_2$.

More specifically, the semiconductor device SD1 has the following configuration. A semiconductor body SB is configured by, for example, a single-crystal semiconductor material. The semiconductor body SB is made of, for example, monocrystalline silicon. Each of a first semiconductor region SR1a, a second semiconductor region SR1b, a third semiconductor region SR3, a fourth semiconductor region SR2a, a fifth semiconductor region SR2b, and a sixth semiconductor region SR4 is formed by doping an impurity into the semiconductor body SB.

As shown in FIG. 1, in the first region R1 of the semiconductor substrate SUB, the first semiconductor region SR1a, the second semiconductor region SR1b, and the third semiconductor region SR3 are formed on the semiconductor body SB. The first semiconductor region SR1a and the second semiconductor region SR1b are formed on the main surface MSF of the semiconductor substrate SUB. The third semiconductor region SR3 is formed on the main surface MSF of the semiconductor substrate SUB so as to surround the first semiconductor region SR1a and the second semiconductor region SR1b. The first semiconductor region SR1a and the second semiconductor region SR1b are spaced apart from each other across the third semiconductor region SR3.

The conductivity types of the first semiconductor region SR1a and the second semiconductor region SR1b are different from the conductivity type of the third semiconductor region SR3. When the conductivity types of the first semiconductor region SR1a and the second semiconductor region SR1b are n-type, the conductivity type of the third semiconductor region SR3 is p-type. When the conductivity types of the first semiconductor region SR1a and the second semiconductor region SR1b are p-type, the conductivity type of the third semiconductor region SR3 is n-type.

As shown in FIG. 1, the first element SE1 is, for example, a MISFET. The first element SE1 includes the first semiconductor region SR1a, the second semiconductor region SR1b, the third semiconductor region SR3, a gate insulating film GI1, a gate electrode GT, and the sidewall insulating film SWI.

The first semiconductor region SR1a is, for example, a source region of the transistor. The second semiconductor region SR1b is, for example, a drain region of the transistor. The third semiconductor region SR3 is a well region of the transistor.

As shown in FIG. 1, the gate insulating film GI1 and the gate electrode GT are formed on the third semiconductor region SR3 sandwiched between the first semiconductor region SR1a and the second semiconductor region SR1b.

As shown in FIG. 1, the gate insulating film GI1 is a laminated body of the first insulating film IF1 and the high-dielectric-constant insulating film HK. The dielectric constant of the first insulating film IF1 is lower than the dielectric constant of the high-dielectric-constant insulating film HK. The first insulating film IF1 separates the high-dielectric-constant insulating film HK from the semiconductor substrate SUB. The first insulating film IF1 is in contact with the third semiconductor region SR3. The high-dielectric-constant insulating film HK is formed on the first insulating film IF1. The gate electrode GT is formed on the gate insulating film GI1. The first insulating film IF1, the high-dielectric-constant insulating film HK, and the gate electrode GT are laminated in this order from the surface of the third semiconductor region SR3 upward. In this specification, the laminated body of the first insulating film IF1, the high-dielectric-constant insulating film HK, and the gate electrode GT is also referred to as the first laminated body ST1.

As shown in FIG. 1, the first laminated body ST1 has an upper surface on which only the gate electrode GT is exposed, and a side surface on which each of the first insulating film IF1, the high-dielectric-constant insulating film HK, and the gate electrode GT is exposed. From a different point of view, the high-dielectric-constant insulating film HK is exposed from the side surface of the first laminated body ST1. The high-dielectric-constant insulating film HK is not exposed from the upper surface of the first laminated body ST1.

As shown in FIG. 1, the sidewall insulating film SWI covers the side surface of the first laminated body ST1.

The material configuring the first insulating film IF1 has an electrically insulating property, has a dielectric constant lower than the dielectric constant of the high-dielectric-constant insulating film HK, and is, for example, at least one of $SiO_2$ and $Si_3N_4$.

The material configuring the gate electrode GT may be any material having conductivity. The gate electrode GT is made of, for example, impurity-doped polysilicon.

As shown in FIG. 1, in the second region R2 of the semiconductor substrate SUB, the fourth semiconductor region SR2a, the fifth semiconductor region SR2b, and the sixth semiconductor region SR4 are formed on the semiconductor body SB. The fourth semiconductor region SR2a and the fifth semiconductor region SR2b are formed on the main surface MSF of the semiconductor substrate SUB. The sixth semiconductor region SR4 is formed on the main surface MSF of the semiconductor substrate SUB so as to surround the fourth semiconductor region SR2a and the fifth semiconductor region SR2b. The fourth semiconductor region SR2a and the fifth semiconductor region SR2b are spaced apart from each other across the sixth semiconductor region SR4.

The conductivity types of the fourth semiconductor region SR2a and the fifth semiconductor region SR2b are different from the conductivity type of the sixth semiconductor region SR4. When the conductivity types of the fourth semiconductor region SR2a and the fifth semiconductor region SR2b are n-type, the conductivity type of the sixth semiconductor region SR4 is p-type. When the conductivity types of the fourth semiconductor region SR2a and the fifth semiconductor region SR2b are p-type, the conductivity type of the sixth semiconductor region SR4 is n-type.

As shown in FIG. 1, the second element SE2 is, for example, a MONOS type memory element, and includes a split-gate type transistor to which a MONOS film is applied. The second element SE2 includes the fourth semiconductor region SR2a, the fifth semiconductor region SR2b, the sixth semiconductor region SR4, a gate insulating film GI2, a control gate electrode CG, a laminated insulating film ONO, a memory gate electrode MG, and cap insulating films CI1, CI2.

The fourth semiconductor region SR2a is, for example, a source region of the memory element. The fifth semiconductor region SR2b is, for example, a drain region of the memory element. The sixth semiconductor region SR4 is a well region of the memory element.

As shown in FIG. 1, the gate insulating film GI2 and the laminated insulating film ONO are formed side by side on the surface of the sixth semiconductor region SR4 sandwiched between the fourth semiconductor region SR2a and the fifth semiconductor region SR2b. The gate insulating film GI2 and the laminated insulating film ONO are in contact with the surface of the sixth semiconductor region SR4.

The control gate electrode CG is formed on the gate insulating film GI2. The gate insulating film GI2 and the control gate electrode CG configure a control gate of the memory element. The memory gate electrode MG is formed on the laminated insulating film ONO. The laminated insulating film ONO and the memory gate electrode MG configure a memory gate of the memory element.

The laminated insulating film ONO has a portion interposed between the sixth semiconductor region SR4 and the memory gate electrode MG and a portion interposed between the control gate electrode CG and the memory gate electrode MG. The control gate electrode CG and the memory gate electrode MG are electrically isolated from each other by the laminated insulating film ONO interposed therebetween. The control gate electrode CG and the memory gate electrode MG may be electrically separated from each other by forming an insulating film that differs from the laminated insulating film ONO therebetween. The memory gate electrode MG is formed in a sidewall shape on the side surface of the control gate electrode CG with the laminated insulating film ONO interposed therebetween.

The cap insulating film CI1 is formed on the control gate electrode CG. Further, the cap insulating film CI2 is formed so as to cover the surface of the second region R2, that is, the main surface MSF of the semiconductor substrate SUB, the gate insulating film GI2, the control gate electrode CG, the laminated insulating film ONO, the memory gate electrode MG, and the cap insulating film CI1.

The gate insulating film GI2 and the laminated insulating film ONO do not include the high-dielectric-constant insulating film HK. The material configuring the gate insulating film GI2 has an electrically insulating property, has a dielectric constant lower than the dielectric constant of the high-dielectric-constant insulating film HK, and is, for example, at least one of $SiO_2$ and $Si_3N_4$. The laminated insulating film ONO is a laminated film in which a silicon oxide film, a silicon nitride film, and a silicon oxide film are laminated. Each of the control gate electrode CG and the memory gate electrode MG may be any conductive material. Each of the control gate electrode CG and the memory gate electrode MG is made of, for example, impurity-doped polysilicon. The material configuring the cap insulating film CI1 is, for example, $Si_3N_4$.

As shown in FIG. 1, the element isolation portion ISL is formed on the semiconductor body SB in the element isolation region R3 of the semiconductor substrate SUB. The step portion STP is formed on the surface of the element isolation portion ISL. The dummy pattern DM1 is formed on the element isolation portion ISL so as to straddle the step portion STP.

The dummy pattern DM1 includes the first insulating film IF1, the high-dielectric-constant insulating film HK, and the first conductive film CF1. The first insulating film IF1, the high-dielectric-constant insulating film HK, and the first conductive film CF1 are laminated on each of the step surface STS, the first terrace surface TRS1, and the second terrace surface TRS2 of the step portion STP in this order. A part of the dummy pattern DM1 is formed on the thick portion ISLa of the element isolation portion ISL. Another portion of the dummy pattern DM1 is formed on the thin portion ISLb of the element isolation portion ISL. The height of the dummy pattern DM1, that is, the shortest distance from the surface of the element isolation portion ISL to the upper surface of the dummy pattern DM1 is equivalent to the height of the laminated body ST1 of the first element SE1.

The lower surface of the first insulating film IF1 is in contact with each of the step surface STS, the first terrace surface TRS1, and the second terrace surface TRS2 of the step portion STP. The lower surface of the high-dielectric-constant insulating film HK is in contact with the upper surface of the first insulating film IF1. The lower surface of the first conductive film CF1 is in contact with the upper surface of the high-dielectric-constant insulating film HK.

In the dummy pattern DM1, the first insulating film IF1, the high-dielectric-constant insulating film HK, and the first conductive film CF1 are exposed from both side surfaces of the dummy pattern DM1 facing away from each other. The sidewall insulating film DSWI covers each of the first insulating film IF1, the high-dielectric-constant insulating film HK, and the first conductive film CF1 exposed from both side surfaces of the dummy pattern DM1.

Each of the first insulating film IF1, the high-dielectric-constant insulating film HK, the first conductive film CF1, and the sidewall insulating film DSWI has the same configuration as the gate insulating film GI1, the high-dielectric-constant insulating film HK, the gate electrode GT, and the sidewall insulating film SWI of the first element SE1.

Manufacturing Method of Semiconductor Device According to First Embodiment

Referring to FIGS. 2 to 11, the manufacturing method of the semiconductor device SD1 according to the first embodiment will be described below.

The manufacturing method of the semiconductor device SD1 includes a step (S1) of preparing the semiconductor substrate SUB in which the step portion STP is formed on the surface of the element isolation portion ISL, a step (S2) of depositing the high-dielectric-constant insulating film HK and the first conductive film CF1 so as to straddle the step portion STP, a step (S3) of forming the dummy pattern DM1 from the high-dielectric-constant insulating film HK and the first conductive film CF1, and a step (S4) of forming the sidewall insulating film SWI.

In the semiconductor substrate SUB prepared in the step (S1), the step portion STP may be formed by any process, but is formed as follows, for example.

The semiconductor substrate SUB having the element isolation portion ISL is prepared (step S1a). The element isolation portion ISL is formed on the main surface MSF in the element isolation region R3 by forming a trench on the main surface MSF in the element isolation region R3 of the semiconductor substrate SUB and filling an insulating film in the trench.

Next, a part of the second element SE2 (the gate insulating film GI2, the control gate electrode CG, and the cap insulating film CI1) is formed in the second region R2 of the semiconductor substrate SUB, and the step portion STP is formed on the element isolation portion ISL (step (S1b)).

Figure 3:
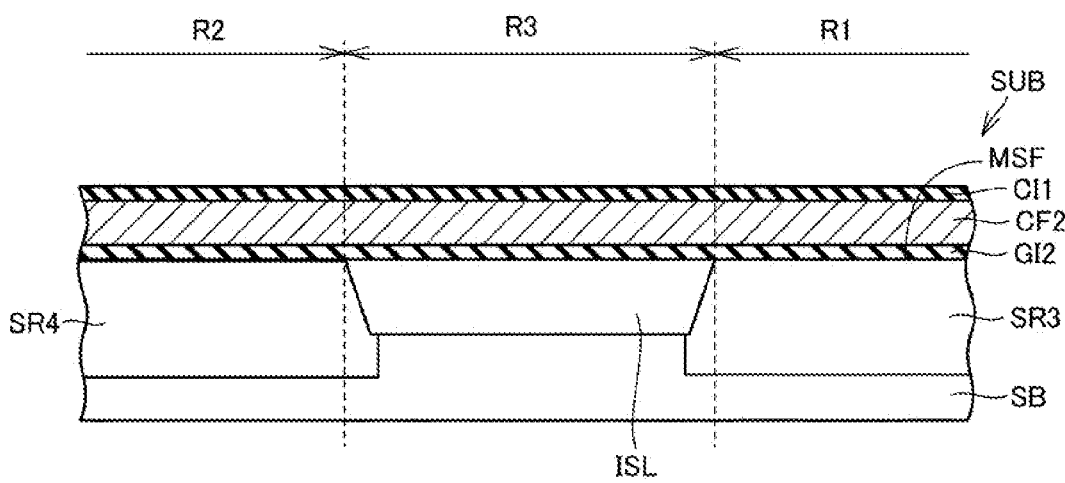
FIG. 3 is a cross-sectional view for explaining one step of the manufacturing method of the semiconductor device according to the first embodiment.

In the step (S1b), first, as shown in FIG. 3, a laminated film (bottom film) of the gate insulating film GI2, the second conductive film CF2, and the cap insulating film CI1 is deposited on the main surface MSF of the semiconductor substrate SUB having the element isolation portion ISL. The deposition method is not particularly limited, but is, for example, a CVD (Chemical Vapor Deposition) method. The gate insulating film GI2, the second conductive film CF2 and the cap insulating film CI1 are formed in each of the first region R1, the second region R2, and the element isolation region R3.

Figure 4:
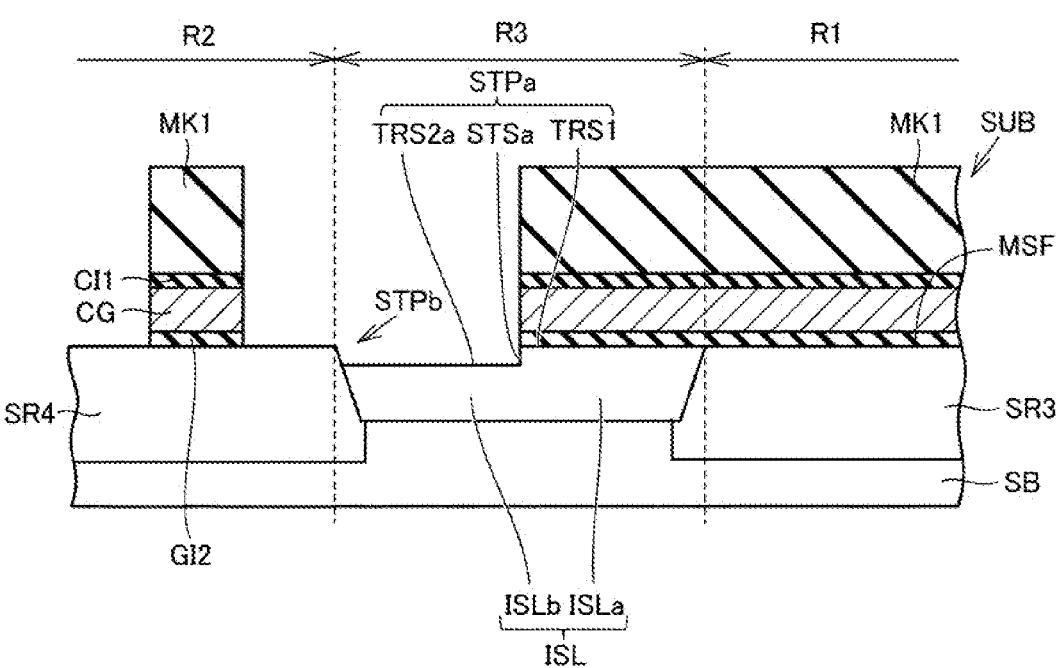
FIG. 4 is a cross-sectional view for explaining one step after the step shown in FIG. 3 in the manufacturing method of the semiconductor device according to the first embodiment.

In the step (S1b), second, as shown in FIG. 4, the gate insulating film GI2, the second conductive film CF2, and the cap insulating film CI1 are patterned by an etching process using a mask MK1. The mask MK1 includes a portion located in a region where the second element SE2 is to be formed in the second region R2, a portion formed over the entire first region R1, and a portion formed on the cap insulating film CI1 so as to cover a portion located in a portion located on the side of the first region R1 in the element isolation portion ISL. An end portion of the portion of the mask MK1 located in the first region R1 (a portion formed over the entire first region) is disposed on the element isolation portion ISL. When an end portion of the portion of the mask MK1 formed over the entire first region R1 is disposed in the first region R1, a portion of a film (for example, a laminated film including the gate insulating film GI2, the second conductive film CF2, and the cap insulating film CI1) formed on the semiconductor substrate SUB in the first region R1 is removed by an etching process, and there is a possibility that a residue of the film may be generated in the first region R1. When the end portion of the portion of the mask MK1 formed over the entire first region R1 are disposed in the second region R2, since the dummy pattern including the gate insulating film GI2, the second conductive film CF2, and the cap insulating film CI1 that do not configure the second element SE2 is formed on the second region R2, the second conductive film CF2 of the second element SE2 and the second conductive film CF2 of the dummy pattern may be short-circuited.

Thus, in the second region R2, the gate insulating film GI2, the control gate electrode CF2, and the cap insulating film CI1 of the second element SE2 are formed, respectively, from the gate insulating film GI2, the second conductive film CF2, and the cap insulating film CI1. Further, in this step, an over-etching process is performed. As a result, the step portion STPa and the step portion STPb are formed on the surface of the element isolation portion ISL. The mask MK1 is then removed.

The step portion STPa has the step surface STSa, the first terrace surface TRS1, and the second terrace surface TRS2a. The step surface STSa, the first terrace surface TRS1, and the second terrace surface TRS2a are surfaces of the insulating film of the element isolation portion ISL. The second terrace surface TRS2a of the step portion STPa is located above the second terrace surface TRS2 of the semiconductor device SD1, for example. The step surface STSa of the step portion STPa is, for example, a part (upper portion) of the step surface STS of the semiconductor device SD1.

The step portion STPb is formed on a side of the second region R2 than the step portion STPa. The step portion STPb includes the step surface which is a part of the sidewall surface of the trench configuring the element isolation portion ISL, the terrace surface which is a part of the upper surface of the thin portion ISLb of the element isolation portion ISL, and the terrace surface which is a part of the main surface MSF of the semiconductor substrate SUB in the second region R2.

The dummy pattern DM1 is formed only on the step portion STP formed of the step portion STPa among the step portion STPa and the step portion STPb. No dummy pattern is formed on the step portion STPb.

The step height of the step portion STPa corresponds to the amount of over-etching in this step. The step height of the step portion STPa is equal to or less than the step height of the step portion STP in the finally manufactured semiconductor device SD1, and is, for example, less than the step height of the step portion STP in the semiconductor device SD1. In the subsequent step, the thin portion of the element isolation portion ISL is made thinner than in the present step, for example.

Figure 5:
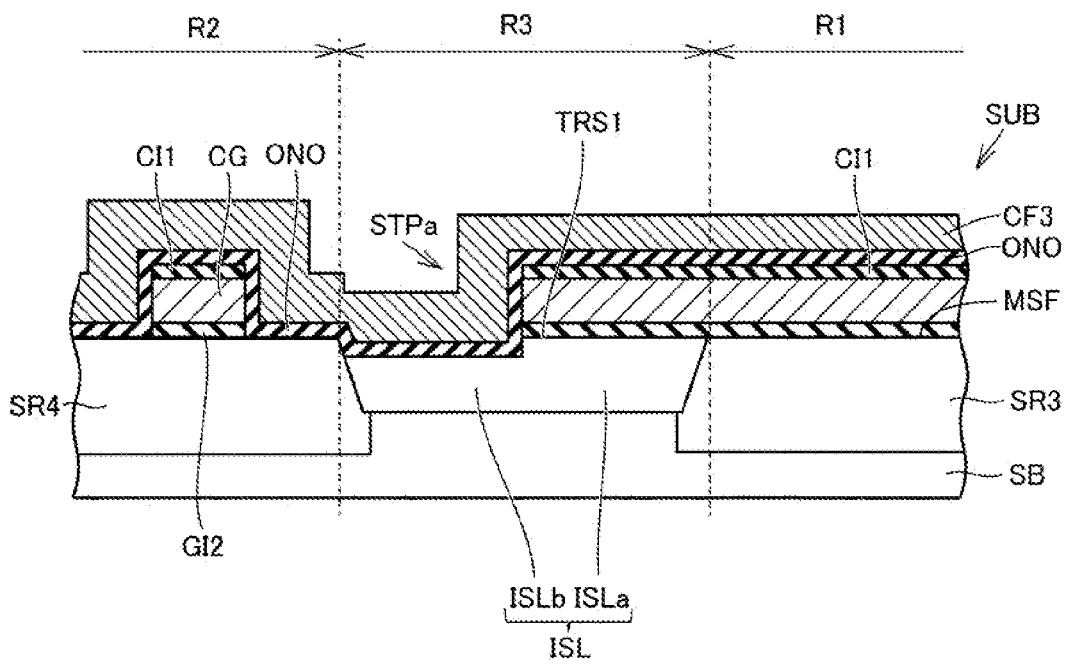
FIG. 5 is a cross-sectional view for explaining one step after the step shown in FIG. 4 in the manufacturing method of the semiconductor device according to the first embodiment.

In the step (S1b), third, as shown in FIG. 5, the laminated insulating film ONO and the third conductive film CF3 are formed so as to straddle the step portion STP. The deposition method of the laminated insulating film ONO and the third conductive film CF3 is not particularly limited, but are, for example, a CVD method. The laminated insulating film ONO and the third conductive film CF3 are deposited in each of the first region R1, the second region R2, and the element isolation region R3.

Figure 6:
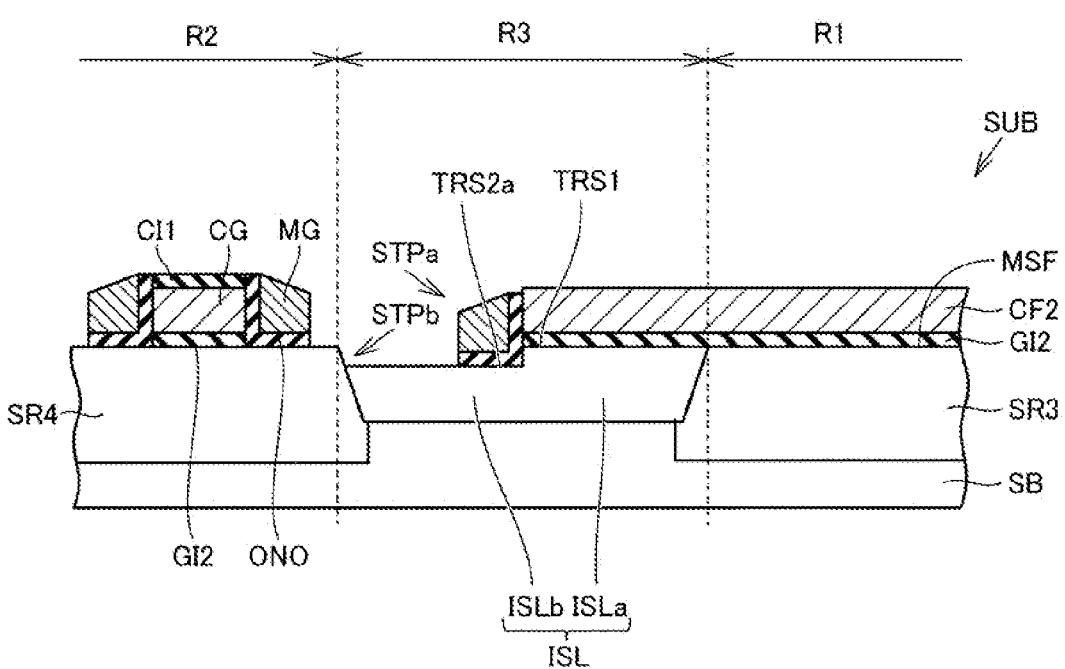
FIG. 6 is a cross-sectional view for explaining one step after the step shown in FIG. 5 in the manufacturing method of the semiconductor device according to the first embodiment.

In the step (S1b), fourth, as shown in FIG. 6, the laminated insulating film ONO and the third conductive film CF3 are subjected to an anisotropic etching (etching-back) process. Thus, in the second region R2, the laminated insulating film ONO and the third conductive film CF3 are processed into a pair of sidewall-like patterns sandwiching the control gate electrode CG. In the element isolation region R3, the residual portions of the laminated insulating film ONO and the third conductive film CF3 are formed on the second terrace surface TRS2a of the step portion STPa of the element isolation portion ISL.

Figure 7:
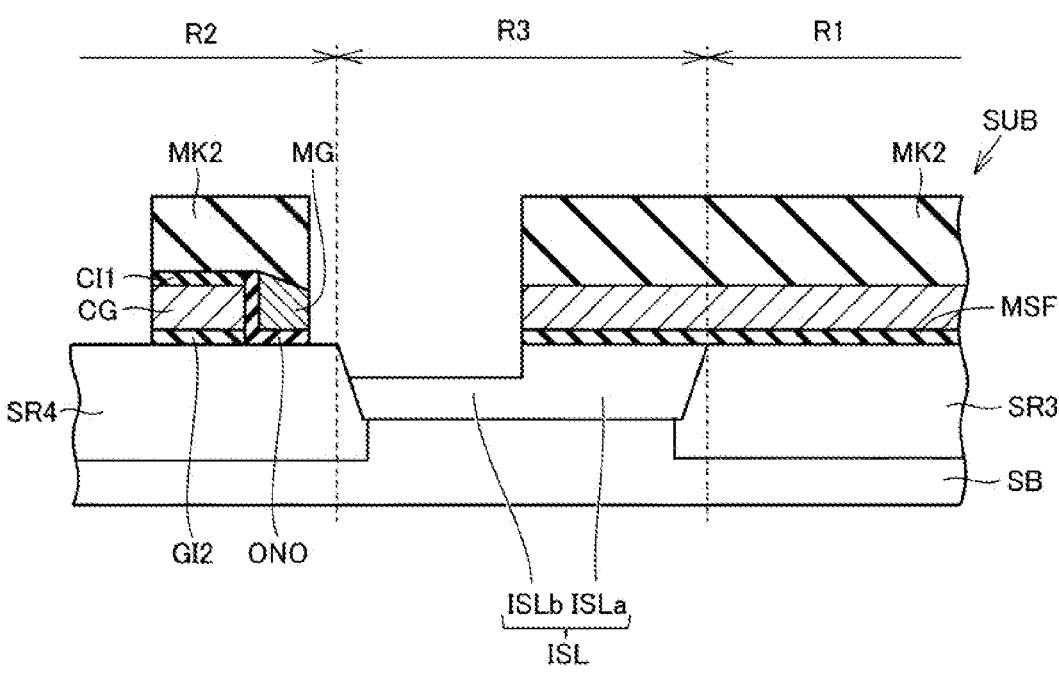
FIG. 7 is a cross-sectional view for explaining one step after the step shown in FIG. 6 in the manufacturing method of the semiconductor device according to the first embodiment.

In the step (S1b), fifth, as shown in FIG. 7, one of the pair of sidewall-shaped pattern formed of the laminated insulating film ONO and the third conductive film CF3 and sandwiching the control gate electrode CG is removed in the second region R2, and the residual portion is removed in the element isolation region R3. Specifically, in the second region R2 and the element isolation region R3, the laminated insulating film ONO and the third conductive film CF3 are removed using a mask MK2 that exposes only the region from which the laminated insulating film ONO and the third conductive film CF3 are to be removed. At this time, the thin portion ISLb of the element isolation portion ISL is further thinned. The mask MK2 is then removed. In this way, the memory gate electrode MG is formed.

The mask MK2 includes a portion located in a region where the second element SE2 is to be formed in the second region R2, a portion formed over the entire first region R1, and a portion disposed on at least a portion of a portion located between the residual portion and the first region R1 in the element isolation portion ISL and formed on the main surface MSF so as to expose the residual portion in the element isolation portion ISL. An end portion of the portion of the mask MK2 formed over the entire first region R1 is disposed between the step portion and the first region R1 in the element isolation region R3. This is because, if the end portion of the portion of the mask MK2 formed over the entire first region R1 is disposed in the first region R1, a portion of the film formed on the semiconductor substrate SUB in the first region R1 may be removed by an etching process, and a residue of the film may be generated in first region R1.

Figure 8:
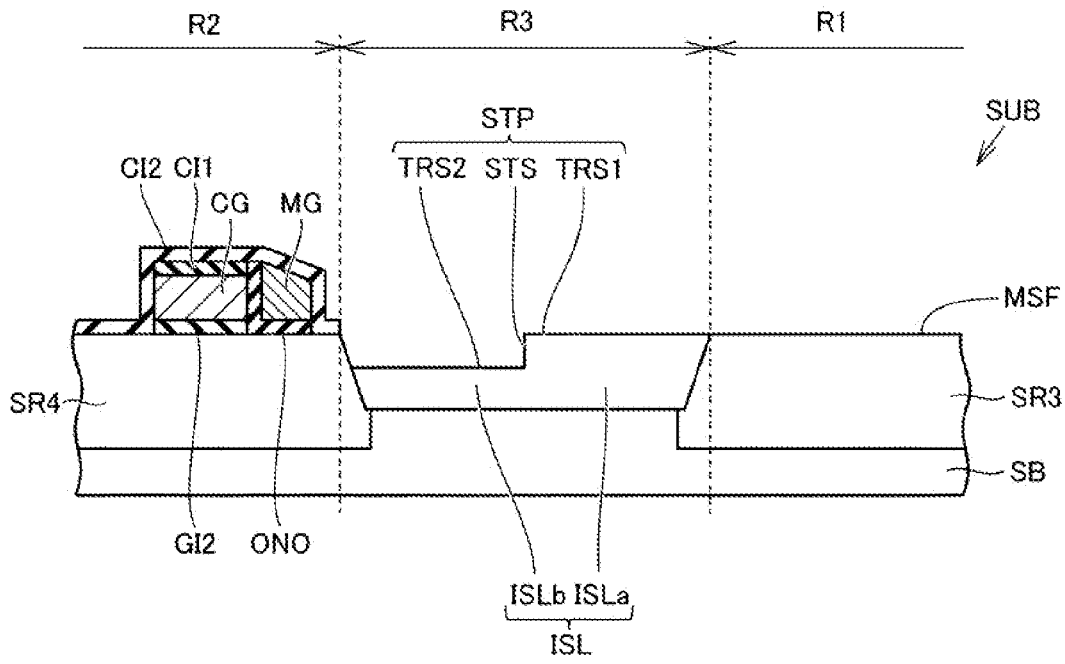
FIG. 8 is a cross-sectional view for explaining one step after the step shown in FIG. 7 in the manufacturing method of the semiconductor device according to the first embodiment.

In the step (S1b), sixth, as shown in FIG. 8, the cap insulating film CI2 is formed on the surface of the second region R2. The cap insulating film CI2 is formed by, for example, forming a film by a CVD method and then patterning the film by photolithography and an etching process. In the step (S1b), the semiconductor substrate SUB in which the step portion STP is formed on the surface of the element isolation portion ISL is formed in this manner. The step portion STP has the step surface STS, the first terrace surface TRS1, and the second terrace surface TRS2.

Figure 9:
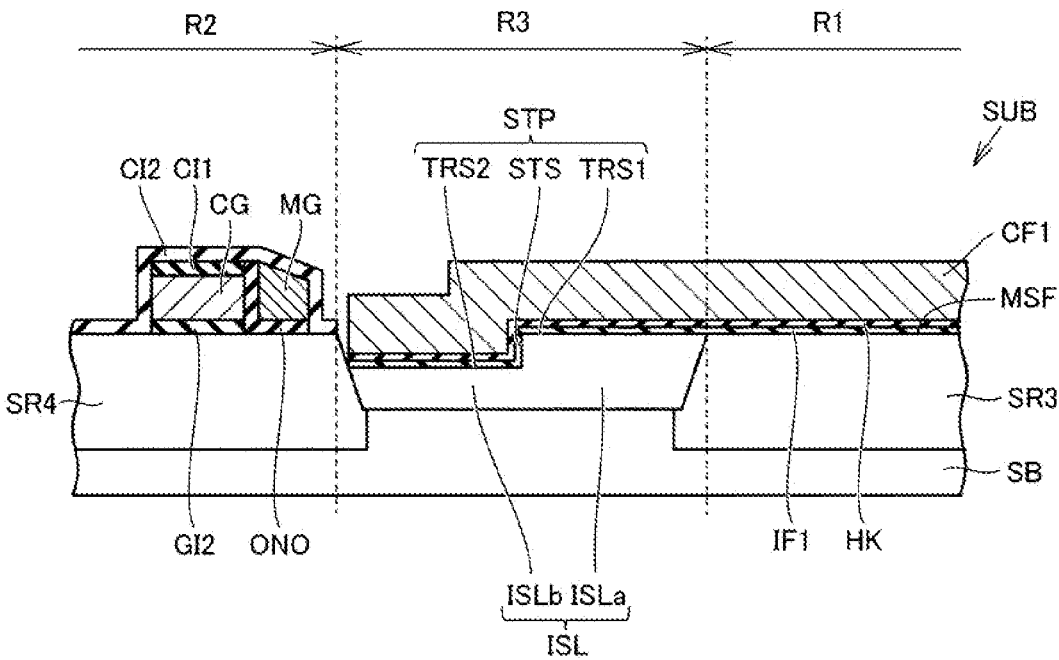
FIG. 9 is a cross-sectional view for explaining one step after the step shown in FIG. 8 in the manufacturing method of the semiconductor device according to the first embodiment.

In the step (S2), as shown in FIG. 9, the first insulating film IF1, the high-dielectric-constant insulating film HK, and the first conductive film CF1 are formed so as to straddle the step portion STP of the semiconductor substrate SUB prepared in the step (S1). The first insulating film IF1, the high-dielectric-constant insulating film HK, and the first conductive film CF1 are deposited in at least the first region R1 and the element isolation region R3. For example, the first insulating film IF1, the high-dielectric-constant insulating film HK, and the first conductive film CF1 are deposited in the first region R1, the second region R2, and the element isolation region R3, and then only the first insulating film IF1, the high-dielectric-constant insulating film HK, and the first conductive film CF1 deposited in the second region R2 are removed, thereby obtaining the structure shown in FIG. 9. The deposition method of the high-dielectric-constant insulating film HK is, for example, an ALD (Atomic layer Deposition) method or a sputtering method. The deposition method of each of the first insulating film IF1 and the first conductive film CF1 is, for example, a CVD method.

As shown in FIG. 9, a step caused by the step portion STP is formed on the upper surface of the first conductive film CF1. The upper surface of the first conductive film CF1 has the flat surface located on the side of the first region R1, the flat surface located on the side of the second region R2, and the step surface connecting between the two flat surfaces and extending in a direction intersecting with each of the flat surfaces.

Figure 10:
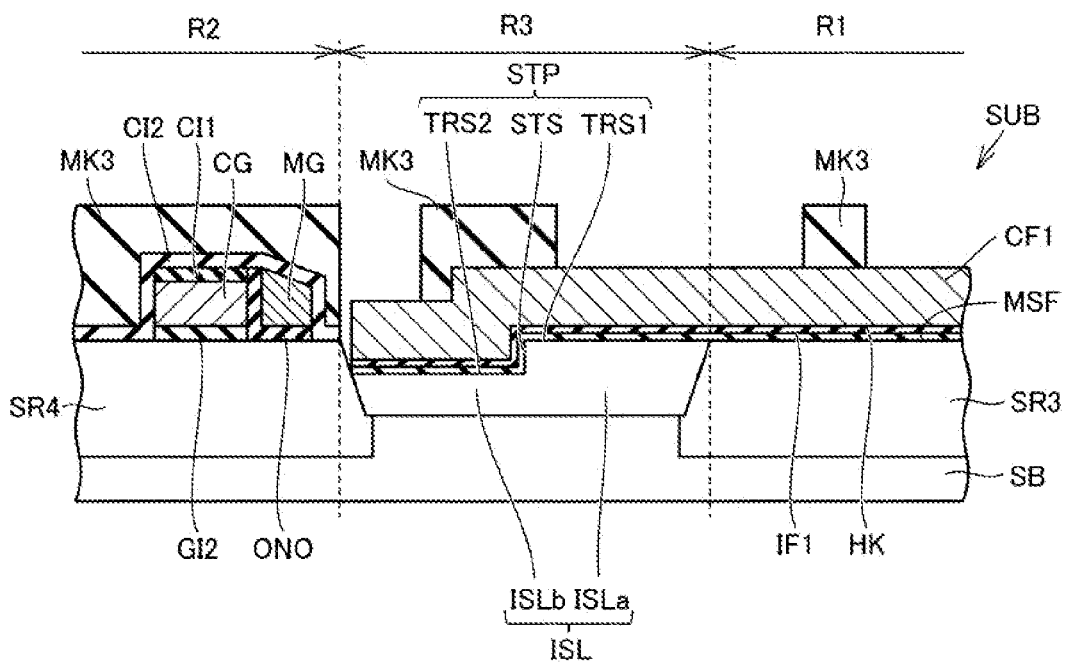
FIG. 10 is a cross-sectional view for explaining one step after the step shown in FIG. 9 in the manufacturing method of the semiconductor device according to the first embodiment.

In the step (S3), first, as shown in FIG. 10, a mask MK3 is formed. The mask MK3 is formed so as to cover a region where the first element SE1 is to be formed in the first region R1, the entire second region R2, and a region that straddles the step portion STP.

As shown in FIG. 10, the mask MK3 located on the element isolation portion ISL is formed so as to straddle the step formed on the upper surface of the first conductive film CF1, for example. The side surface of the mask MK3 located on the element isolation portion ISL and facing the first region R1 is formed on the thick portion ISLa of the element isolation portion ISL. The side surface of the mask MK3 located on the element isolation portion ISL and facing the second region R2 is formed on the thin portion ISLb of the element isolation portion ISL and on the side of the second region R2 than the step surface of the upper surface of the first conductive film CF1.

Figure 11:
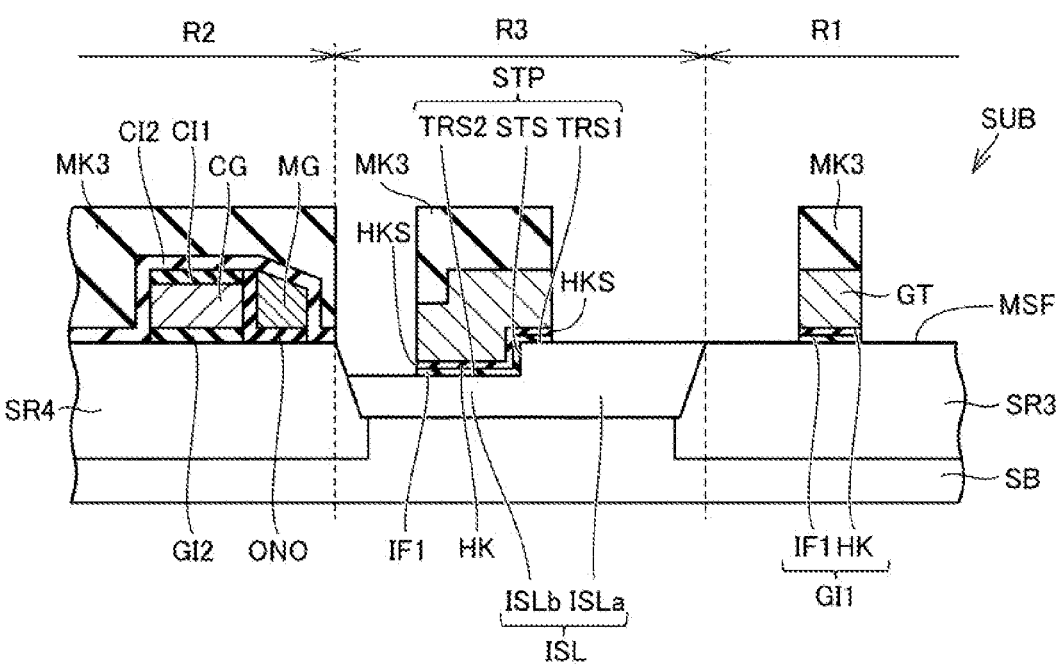
FIG. 11 is a cross-sectional view for explaining one step after the step shown in FIG. 10 in the manufacturing method of the semiconductor device according to the first embodiment.

In the step (S3), second, as shown in FIG. 11, the first insulating film IF1, the high-dielectric-constant insulating film HK, and the first conductive film CF1 exposed from the mask MK3 are partially removed. Thus, in the first region R1, the gate insulating film GI1 of the first element SE1 is formed of the first insulating film IF1 and the high-dielectric-constant insulating film HK, and the gate electrode GT is formed of the first conductive film CF1. That is, the first laminated body ST1 formed of the first insulating film IF1, the high-dielectric-constant insulating film HK, and the gate electrode GT is formed. Further, in the element isolation region R3, the dummy pattern DM1 is formed so as to straddle the step portion STP. In the dummy pattern DM1 in this step (S3), the side surface HKS of the high-dielectric-constant insulating film HK located on the thick portion ISLa of the element isolation portion ISL and the side surface HKS of the high-dielectric-constant insulating film HK located on the thin portion ISLb of the element isolation portion ISL are exposed to the outside. The mask MK3 is removed after the removal is completed.

Figure 12:
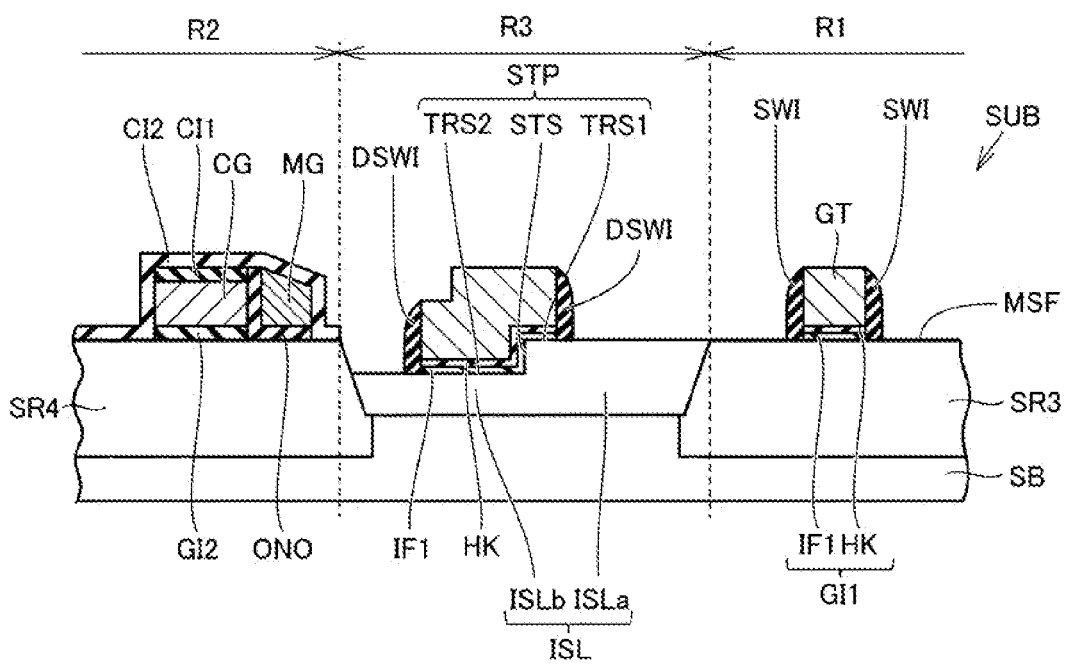
FIG. 12 is a cross-sectional view for explaining one step after the step shown in FIG. 11 in the manufacturing method of the semiconductor device according to the first embodiment.

In the step (S4), as shown in FIG. 12, the sidewall insulating film SWI covering both side surfaces of the first laminated body ST1 of the first element SE1 and the sidewall insulating film DSWI covering both side surfaces of the dummy pattern DM1 are formed. The sidewall insulating film SWI and the sidewall insulating film DSWI are simultaneously formed by forming an insulating film (not shown) so as to cover the main surface MSF of the semiconductor substrate SUB, and then performing an anisotropic etching process on the insulating film.

In this way, the main part of the semiconductor device SD1 shown in FIG. 1 is manufactured.

Effect

The effect of the semiconductor device SD1 will be described based on the comparison with the semiconductor device according to the comparative example.

The semiconductor device according to the comparative example includes, instead of the dummy pattern DM1, a residual portion (dummy pattern) which is left in a sidewall shape with respect to the step surface of the step portion and is not formed so as to straddle the step portion. The dummy pattern in the comparative example remains when the mask MK3 is not formed on the step portion STP of the element isolation portion ISL when the gate insulating film and the gate electrode of the first element are formed from the first insulating film, the high-dielectric-constant insulating film, and the first conductive film, and an anisotropic etching process is performed on the entire first insulating film IF1, the high-dielectric-constant insulating film HK, and the first conductive film CF1 in the element isolation region R3. The dummy pattern in the comparative example has an upper surface and a side surface located on the side of the second region, and the high-dielectric-constant insulating film is exposed from the upper surface and the side surface of the dummy pattern.

In the semiconductor device according to the comparative example, the high-dielectric-constant insulating film HK is exposed from the upper surface and the side surface of the dummy pattern. The protective film covering the upper surface of the dummy pattern in the comparative example cannot be formed in the step of forming the sidewall insulating film covering the side surfaces of the gate insulating film and the gate electrode of the first element. In addition, the height of the side surface of the dummy pattern in the comparative example (the length perpendicular to the main surface MSF) is lower than the height of the side surfaces of the gate insulating film and the gate electrode of the first element. Therefore, in the step of forming the sidewall insulating film covering the side surfaces of the gate insulating film and the gate electrode of the first element, it is difficult to form the insulating film covering the upper surface and the side surfaces of the dummy pattern in the comparative example.

Therefore, in the semiconductor device according to the comparative example, it is difficult to prevent the high-dielectric-constant insulating film HK from being exposed in the dummy pattern. Consequently, in the manufacturing method of the semiconductor device according to the comparative example, a part of the material configuring the high-dielectric-constant insulating film is detached and re-adhered to another region of the semiconductor device or an unintended location in the manufacturing apparatus or the like during the respective processes performed while the upper surface and the side surfaces of the dummy pattern are exposed.

On the other hand, in the semiconductor device SD1, the sidewall insulating film DSWI covers the high-dielectric-constant insulating film HK exposed from both side surfaces of the dummy pattern DM1, so that it is possible to prevent the part of the material configuring the high-dielectricconstant insulating film HK from detaching and re-adhering to another region of the semiconductor device or an unintended location in the manufacturing apparatus.

In the semiconductor device according to the comparative example, a method of removing the dummy pattern in the step of forming the gate insulating film and the gate electrode of the first device is exemplified as a method of solving the above-described problem. However, when the step height of the step portion exceeds the film thickness of the high-dielectric-constant insulating film, it is difficult to completely remove the dummy pattern remaining in the sidewall shape on the step surface of the step portion in the step of forming the gate insulating film and the gate electrode of the first element. In order to completely remove the dummy pattern in the comparative example, it is necessary to perform a step for only removing the dummy pattern.

On the other hand, the manufacturing method of the semiconductor device SD1 does not require a step for only removing the dummy pattern. In the step (S3), a gate insulating film GI and the gate electrode GT of the first element SE1 are formed by using the mask MK3 covering the step portion STP, thereby simultaneously forming the dummy pattern DM1. As a consequence, the semiconductor device SD1 in which detachment and re-adhesion of the material configuring the high-dielectric-constant insulating film are prevented can be manufactured with a man-hour equivalent to that of the semiconductor device according to the comparative example in which detachment and re-adhesion of the material configuring the high-dielectric-constant insulating film are not prevented.

In the semiconductor device according to the comparative example, when the step height of the step portion exceeds the film thickness of the high-dielectric-constant insulating film HK, the residual portion formed in a sidewall shape on the step surface of the step portion is hardly removed. Therefore, it is difficult to solve the above-described problem caused by the exposure of the high-dielectric-constant insulating film from the upper surface of the dummy pattern in the comparative example.

On the other hand, as described above, in the semiconductor device SD1, even if the step height of the step portion STP exceeds the film thickness of the high-dielectric-constant insulating film HK, it is possible to prevent the part of the material configuring the high-dielectric-constant insulating film from being detached and re-adhered to another region of the semiconductor device SD1 or an unintended location in the manufacturing apparatus.

Second Embodiment

Configuration of Semiconductor Device According to Second Embodiment

Figure 13:
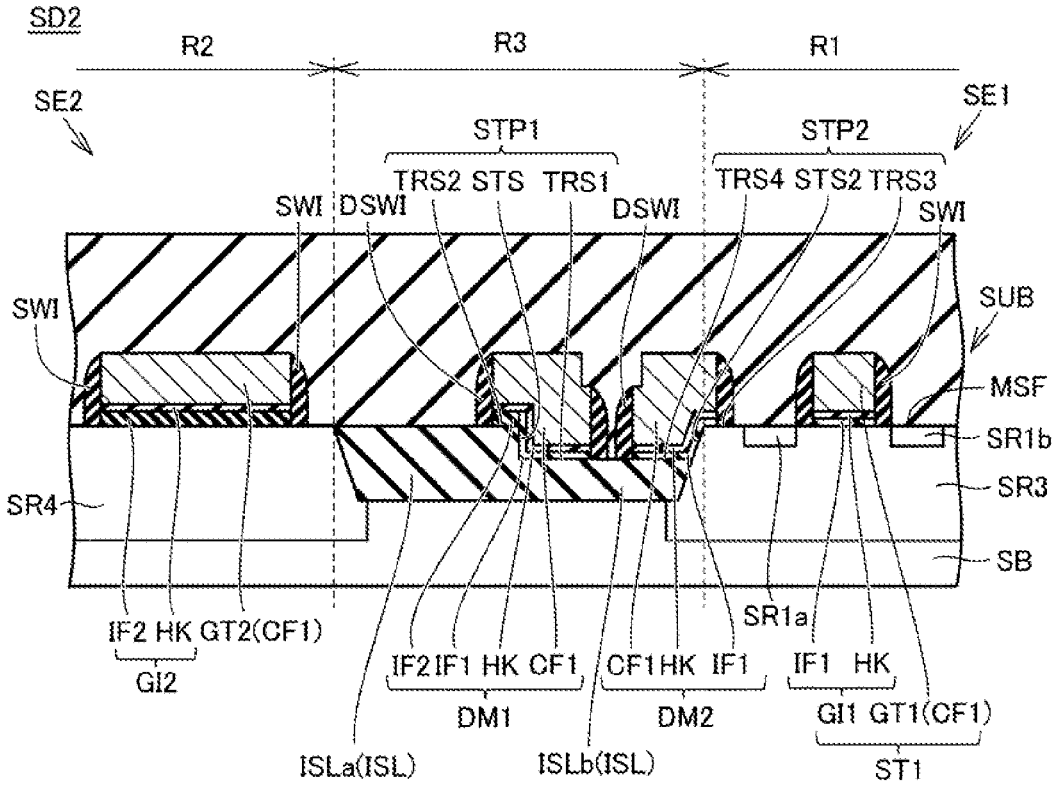
FIG. 13 is a cross-sectional view showing a semiconductor device according to a second embodiment.

As shown in FIG. 13, a semiconductor device SD2 according to the second embodiment has basically the same configuration as the semiconductor device SD1 according to the first embodiment, but is different from in that the first element SE1 and the second element SE2 include the high-dielectric-constant insulating film HK and include a dummy pattern DM2 in addition to the dummy pattern DM1. In the following, how the semiconductor device SD2 differs from the semiconductor device SD1 will be described.

As shown in FIG. 13, the second element SE2 includes the high-dielectric-constant insulating film HK (a second high-dielectric-constant insulating film) like the first element SE1. The second element SE2 is, for example, a high-withstand-voltage semiconductor element whose withstand voltage is higher than that of the first element SE1. The second element SE2 includes the gate insulating film GI2, a gate electrode GT2, and the sidewall insulating film SWI covering side surfaces of the gate insulating film GI2 and the gate electrode GT2. The gate insulating film GI2 of the second element SE2 includes a second insulating film IF2 (bottom film) and the high-dielectric-constant insulating film HK.

As shown in FIG. 13, a first step portion STP1 and a second step portion STP2 are formed on the surface of the element isolation portion ISL.

As shown in FIG. 13, the first step portion STP1 has basically the same configuration as the step portion STP in the semiconductor device SD1 shown in FIG. 1, but differs from the step portion STP in that the first terrace surface TRS1 located on the side of the first region R1 than the step surface STS is formed at a position lower than the second terrace surface TRS2 located on the side of the second region R2 than the step surface STS. In the element isolation portion ISL of the semiconductor device SD2, the thick portion ISLa is formed on the side of the second region R2 and the thin portion ISLb is formed on the side of the first region R1.

As shown in FIG. 13, the second step portion STP2 has a second step surface STS2, a third terrace surface TRS3, and a fourth terrace surface TRS4. The second step surface STS2 is a part of the sidewall surface of the trench configuring the element isolation portion ISL. The second step surface STS2 is located on the side of the first region R1 than the first step portion STP1 and faces the second region R2. The third terrace surface TRS3 is located on the side of the first region R1 than the second step surface STS2. The third terrace surface TRS3 is a part of the main surface MSF of the semiconductor substrate SUB in the first region R1. The fourth terrace surface TRS4 is located on the side of the second region R2 than the second step surface STS2. The fourth terrace surface TRS4 is connected to the third terrace surface TRS3 via the second step surface STS2. The fourth terrace surface TRS4 is a part of the upper surface of the thin portion ISLb of the element isolation portion ISL. The fourth terrace surface TRS4 is located, for example, on the same plane as the first terrace surface TRS1 of the first step portion STP1.

As shown in FIG. 13, in the first step portion STP1 of the semiconductor device SD2, each of the step surface STS, the first terrace surface TRS1, and the second terrace surface TRS2 is configured by the surface of the element isolation portion ISL. In the second step portion STP2 of the semiconductor device SD2, the second step surface STS2 and the third terrace surface TRS3 are configured by the surface of the semiconductor substrate SUB, and the fourth terrace surface TRS4 is configured by the surface of the element isolation portion ISL.

As shown in FIG. 13, the semiconductor device SD2 includes the first dummy pattern DM1 formed so as to straddle the first step portion STP1, and the second dummy pattern DM2 formed so as to straddle the second step portion STP2. The second dummy pattern DM2 has the same configuration as the part of the first element SE1. In the first dummy pattern DM1, the first portion located on the thick portion ISLa of the element isolation portion ISL has the same configuration as the part of the second element SE2. In the first dummy pattern DM1, the second portion located on the thin portion ISLb of the element isolation portion ISL has the same configuration as the part of the first element SE1. The first insulating film IF1 included in the first dummy pattern DM1 is in contact with, for example, the step surface STS and the side surface of the second insulating film IF2 facing the first region R1.

In the manufacturing method of the semiconductor device SD2 described later, the first dummy pattern DM1 and the second dummy pattern DM2 are formed at the same time in the step of forming a part of each of the first element SE1 and the second element SE2.

As shown in FIG. 13, only the first conductive film CF1 is exposed on the upper surface of the first dummy pattern DM1 and the second dummy pattern DM2. In each of the first dummy pattern DM1 and the second dummy pattern DM2, the high-dielectric-constant insulating film HK is exposed from both side surfaces facing away from each other. The high-dielectric-constant insulating film HK is exposed from both side surfaces of the first dummy pattern DM1 and the second dummy pattern DM2, and is not exposed from the upper surface.

As shown in FIG. 13, the semiconductor device SD2 further includes the sidewall insulating film DSWI that covers the high-dielectric-constant insulating film HK exposed from both side surfaces of the first dummy pattern DM1, and the sidewall insulating film DSWI that covers the high-dielectric-constant insulating film HK exposed from both side surfaces of the second dummy pattern DM2.

As shown in FIG. 13, the second dummy pattern DM2 is electrically isolated from the first element SE1. The second dummy pattern DM2 is electrically isolated from the first semiconductor region SR1$a$ and the second semiconductor region SR1$b$.

In the semiconductor device SD2, the gate insulating film GI2 of the second element SE2 may be a laminated film of the second insulating film IF2 and the first insulating film IF1 formed on the second insulating film IF2. In the first dummy pattern DM1, the second portion located on the side of the second region R2 than the step surface STS is formed of a laminated film of the second insulating film IF2, the first insulating film IF1, and the first conductive film CF1.

Manufacturing Method of Semiconductor Device SD2

The manufacturing method of the semiconductor device SD2 has basically the same configuration as the manufacturing method of the semiconductor device SD1. In the following, how the manufacturing method of the semiconductor device SD2 differs mainly from the manufacturing method of the semiconductor device SD1 will be described.

In the step (S1), the semiconductor substrate SUB is prepared in which the first step portion STP1 and the second step portion STP2 are formed on the surface of the element isolation portion ISL.

Specifically, a part of the second element SE2 (the second insulating film IF2) is formed in the second region R2 of the semiconductor substrate SUB including the element isolation portion ISL prepared in the step (S1$a$), whereby the first step portion STP1 and the second step portion STP2 are formed on the surface of the element isolation portion ISL (step (S1$c$)).

Figure 14:
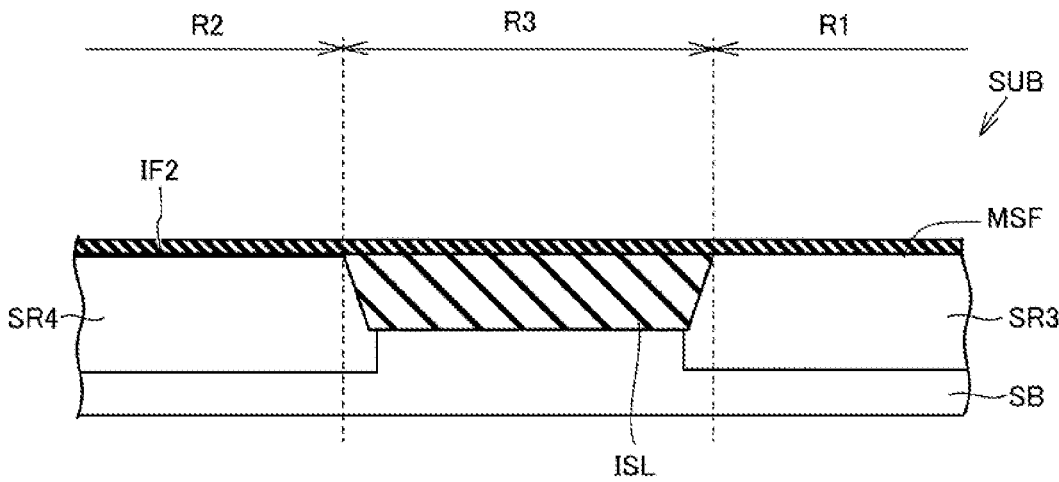
FIG. 14 is a cross-sectional view for explaining one step of the manufacturing method of the semiconductor device according to the second embodiment.

In the step (S1$c$), first, as shown in FIG. 14, the second insulating film IF2 is formed on the main surface MSF of the semiconductor substrate SUB having the element isolation portion ISL. The deposition method is not particularly limited, but is, for example, a CVD method. The second insulating film IF2 is formed in each of the first region R1, the second region R2, and the element isolation region R3.

Figure 15:
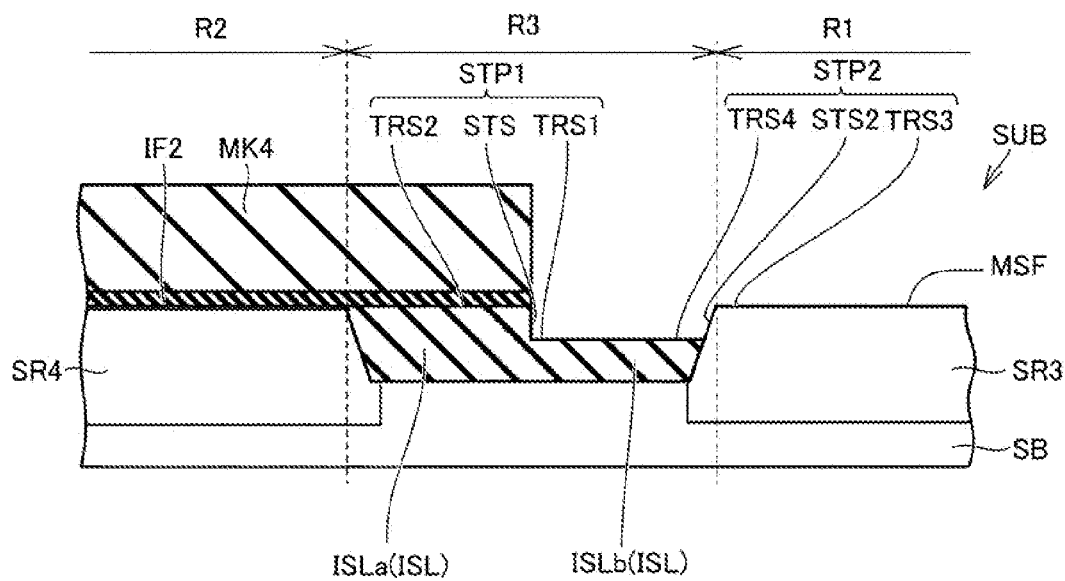
FIG. 15 is a cross-sectional view for explaining one step after the step shown in FIG. 14 in the manufacturing method of the semiconductor device according to the second embodiment.

In the step (S1$c$), second, as shown in FIG. 15, the second insulating film IF2 is patterned by an etching process using a mask MK4. The mask MK4 is formed on the second insulating film IF2 so as to cover the entire second region R2 and a part of the element isolation portion ISL located on the side of the second region R2.

As a result, in the second region R2, the second insulating film IF2 is formed in a portion located in the second region R2 and on the side of the second region R2 in the element isolation portion ISL. Further, in this step, an over-etching process is performed. As a result, the first step portion STP1 and the second step portion STP2 are formed on the surface of the element isolation portion ISL. The mask MK4 is then removed.

The first step portion STP1 is basically the same as the step portion STP formed in the step (S1b) of the manufacturing method of the semiconductor device SD1, and has the step surface STS, the first terrace surface TRS1, and the second terrace surface TRS2. The step surface STS, the first terrace surface TRS1, and the second terrace surface TRS2 are surfaces of the insulating film of the element isolation portion ISL.

The second step portion STP2 is basically the same as the step portion STPb formed in the step (S1b) of the manufacturing method of the semiconductor device SD1, but is formed on the side of the first region R1 than the first step portion STP1. The second step portion STP2 is configured by the second step surface STS2 which is a part of the sidewall surface of the trench configuring the element isolation portion ISL, the third terrace surface TRS3 which is formed of a part of the main surface MSF of the semiconductor substrate SUB in the first region R1, and the fourth terrace surface TRS4 which is formed of a part of the upper surface of the thin portion ISLb of the element isolation portion ISL. The fourth terrace surface TRS4 of the second step portion STP2 is located on the same plane as the first terrace surface TRS1 of the first step portion STP1.

In the step (S2), first, the first insulating film IF1 is formed so as to cover at least the entire first region R1 and the entire thin portion ISLb located on the side of the first region R1 in the element isolation portion ISL. The first insulating film IF1 is formed so as to be in contact with the first terrace surface TRS1 and the step surface STS of the first step portion STP1, the second step surface STS2, the third terrace surface TRS3 and the fourth terrace surface TRS4 of the second step portion STP2, and the side surface of the second insulating film IF2. The first insulating film IF1 is formed by patterning an insulating film formed by, for example, a CVD method by photolithography and an etching process.

Figure 16:
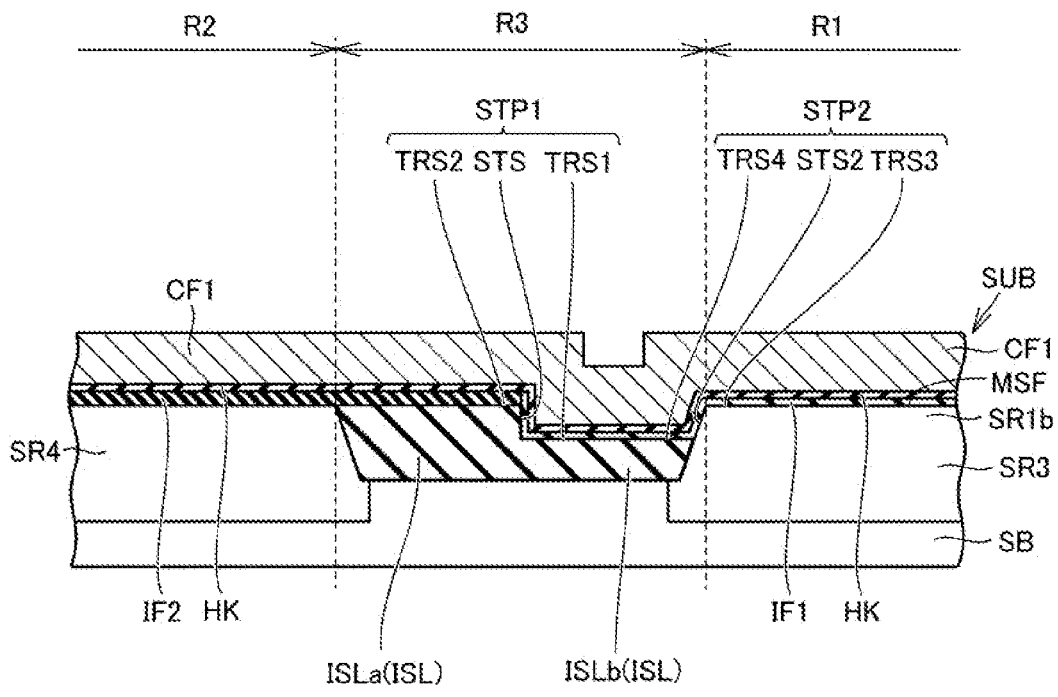
FIG. 16 is a cross-sectional view for explaining one step after the step shown in FIG. 15 in the manufacturing method of the semiconductor device according to the second embodiment.

As described above, the first insulating film IF1 may be formed on the second insulating film IF2. In the step (S2), second, as shown in FIG. 16, the high-dielectric-constant insulating film HK and the first conductive film CF1 are formed so as to straddle the first step portion STP1 and the second step portion STP2. The high-dielectric-constant insulating film HK and the first conductive film CF1 are formed in each of the first region R1, the second region R2, and the element isolation region R3. In the first region R1 and on the thin portion ISLb of the element isolation portion ISL, the high-dielectric-constant insulating film HK is formed on the first insulating film IF1. In the second region R2 and on the thick portion ISLa of the element isolation portion ISL, the high-dielectric-constant insulating film HK is formed on the second insulating film IF2. The deposition method of the high-dielectric-constant insulating film HK is, for example, an ALD method. The first conductive film CF1 is formed by, for example, a CVD method.

Figure 17:
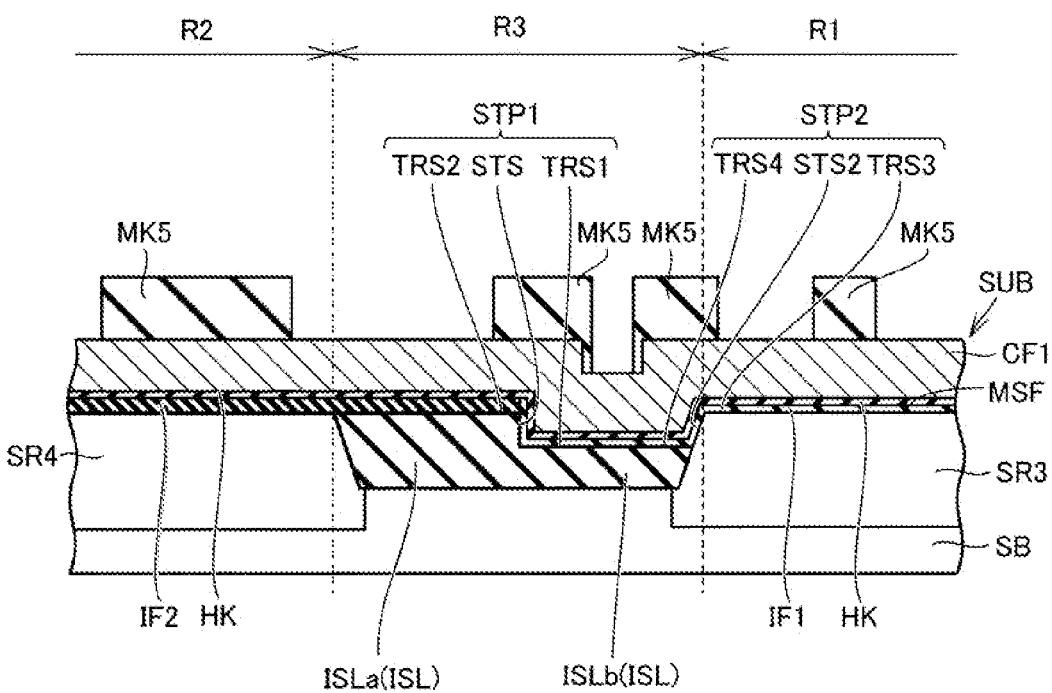
FIG. 17 is a cross-sectional view for explaining one step after the step shown in FIG. 16 in the manufacturing method of the semiconductor device according to the second embodiment.

In the step (S3), first, as shown in FIG. 17, a mask MK5 is formed. The mask MK5 is formed so as to cover a region in which each of the first element SE1 and the second element SE2 is to be formed, a region that straddles the first step portion STP1, and a region that straddles the second step portion STP2.

Figure 18:
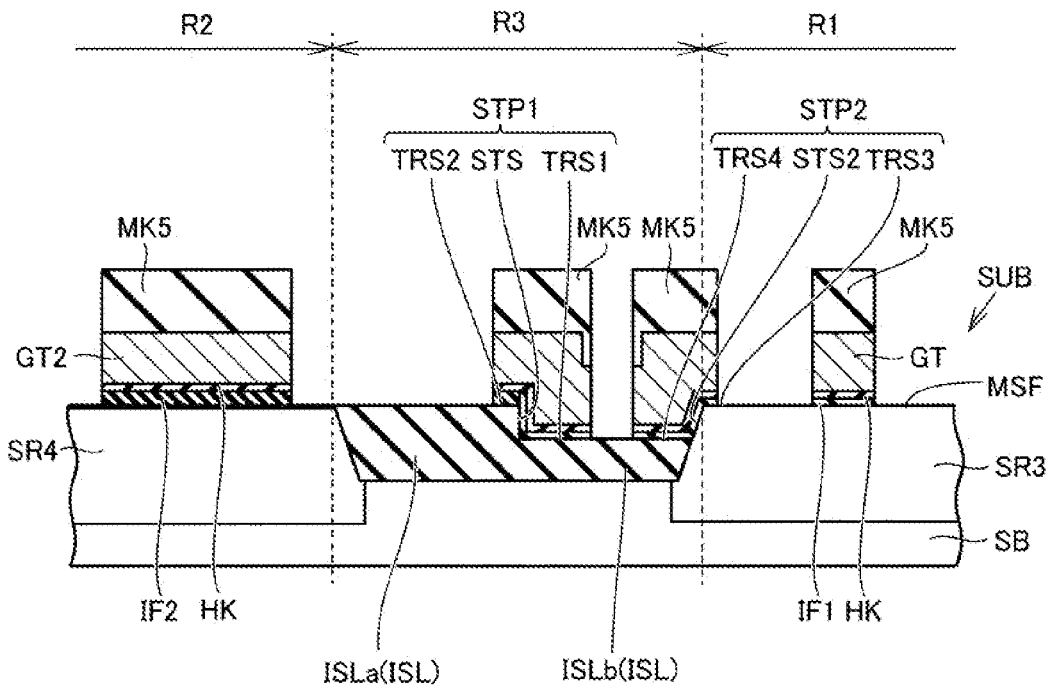
FIG. 18 is a cross-sectional view for explaining one step after the step shown in FIG. 17 in the manufacturing method of the semiconductor device according to the second embodiment.

In the step (S3), second, as shown in FIG. 18, the laminated film of the first insulating film IF1, the high-dielectric-constant insulating film HK and the first conductive film CF1 in the first region R1 and the laminated film of the second insulating film IF2, the high-dielectric-constant insulating film HK, and the first conductive film CF1 in the second region R2 are simultaneously patterned by the etching process using the mask MK5. Thus, in the first region R1, the gate insulating film GI and a gate electrode GT1 of the first element SE1 are formed from the laminated film of the first insulating film IF1, the high-dielectric-constant insulating film HK, and the first conductive film CF1. In the second region R2, the gate insulating film GI2 and the gate electrode GT2 of the second element SE2 are formed from the laminated film of the second insulating film IF2, the high-dielectric-constant insulating film HK, and the first conductive film CF1. Further, in the element isolation region R3, the first dummy pattern DM1 is formed so as to straddle the first step portion STP1, and the second dummy pattern DM2 is formed so as to straddle the second step portion STP2.

In each of the first dummy pattern DM1 and the second dummy pattern DM2 in this step (S3), the side surface of the high-dielectric-constant insulating film HK is exposed to the outside. The mask MK5 is removed after the removal is completed.

In the step (S4), the sidewall insulating film SWI covering each of both side surfaces of the gate insulating film GI1 and the gate electrode GT1 of the first element SE1 and both side surfaces of the gate insulating film GI2 and the gate electrode GT2 of the second element SE2 is formed, and the sidewall insulating film DSWI covering both side surfaces of each of the first dummy pattern DM1 and the second dummy pattern SE2 is formed. The sidewall insulating film SWI and the sidewall insulating film DSWI are simultaneously formed by forming an insulating film (not shown) so as to cover the main surface MSF of the semiconductor substrate SUB, and then performing an anisotropic etching process on the insulating film.

In this way, the main part of the semiconductor device SD2 shown in FIG. 13 is manufactured.

Effect

In the semiconductor device SD2, each of the first element SE1 and the second element SE2 includes the high-dielectric-constant insulating film HK. Therefore, in the manufacturing method of the semiconductor device SD2, the high-dielectric-constant insulating film HK is preferably deposited over the first region R1, the second region R2, and the element isolation region R3. On the other hand, the high-dielectric-constant insulating film HK deposited in this manner straddles each of the first step portion STP1 and the second step portion STP2 formed on the surface of the element isolation portion ISL. Therefore, when the high-dielectric-constant insulating film HK is processed in the same manner as the manufacturing method of the semiconductor device according to the comparative example described above, a sidewall-shaped dummy pattern is formed on each of the step surfaces of the first step portion STP1 and the second step portion STP2, and further, the high-dielectric-constant insulating film is exposed on the upper surface and the side surface of each dummy pattern. As described above, in the step of forming the sidewall insulating film on the side surfaces of the gate insulating film and the gate electrode of each of the first element and the second element, it is difficult to form the protective film covering the upper surface and the side surfaces of the dummy pattern at the same time as the sidewall insulating film.

On the other hand, in the semiconductor device SD2, the sidewall insulating film DSWI covers both side surfaces of the first dummy pattern DM1 and the second dummy pattern DM2, so that it is possible to prevent a part of the material configuring the high-dielectric-constant insulating film from detaching and re-adhering to another region of the semiconductor device SD2 or an unintended location in the manufacturing apparatus.

In the manufacturing method of the semiconductor device SD2, as in the manufacturing method of the semiconductor device SD1, there is no need for a step aimed only at removing the dummy pattern. In the step (S3), the gate insulating film GI1 and the gate electrode GT1 of the first element SE1 and the gate insulating film GI2 and the gate electrode GT2 of the second element SE2 are formed using the mask MK5 covering the first step portion STP1 and the second step portion STP2, and then the first dummy pattern DM1 and the second dummy pattern DM2 can be formed simultaneously with them. Therefore, the manufacturing cost of the semiconductor device SD2 is suppressed to be lower than the manufacturing cost of the semiconductor device manufactured through a step aimed only at removing the dummy pattern.

Third Embodiment

Configuration of Semiconductor Device According to Third Embodiment

A semiconductor device SD3 according to the third embodiment has basically the same configuration as the semiconductor device SD2 according to the second embodiment, but differs from the semiconductor device SD2 in that the high-dielectric-constant insulating film HK has a plurality of fine metal particles MFP dispersed therein. In the following, how the semiconductor device SD3 differs from the semiconductor device SD2 will be described.

The high-dielectric-constant insulating film HK in the semiconductor device SD3 has a property as a ferroelectric. The high-dielectric-constant insulating film HK includes the dielectric film HKB made of a material having a dielectric constant higher than the dielectric constant of silicon nitride ($Si_3N_4$), and a plurality of fine metal particles MFP added to the dielectric film HKB. The material configuring the dielectric film HKB includes a first metal. Preferably, the first metal includes at least one selected from the group consisting of hafnium (Hf), zirconium (Zr), tantalum (Ta), aluminum (Al), and yttrium (Y). The material configuring the dielectric film HKB is, for example, $HfO_2$. A crystal structure of the dielectric film HKB in the high-dielectric-constant insulating film HK is orthorhombic. The plurality of fine metal particles MFP is dispersed on the surface or in the dielectric film HKB. The plurality of fine metal particles MFP includes a second metal different from the first metal. The plurality of fine metal particles MFP is made of a single second metal or an alloy. When the first metal is Hf, the second metal is, for example, Al or Ti. The plurality of fine metal particles MFP includes, for example, at least one selected from the group consisting of Al, aluminum oxide ($AlO_2$), and aluminum nitride (AlN) and Ti.

Figure 19:
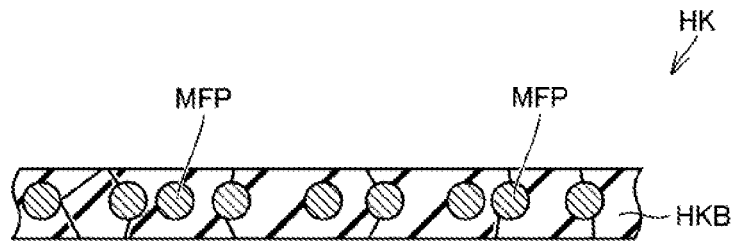
FIG. 19 is a cross-sectional view for explaining a high-dielectric-constant insulating film of a semiconductor device according to a third embodiment.

The particle size of the metal particle MFP is on the order of nanometers. As shown in FIG. 19, the plurality of fine metal particles MFP is disposed in the high-dielectric-constant insulating film HK so as to be dispersed in the extension direction of the high-dielectric-constant insulating film HK. The plurality of fine metal particles MFP may be disposed in the high-dielectric-constant insulating film HK so as to be dispersed in the thickness direction of the high-dielectric-constant insulating film HK.

Figure 20:
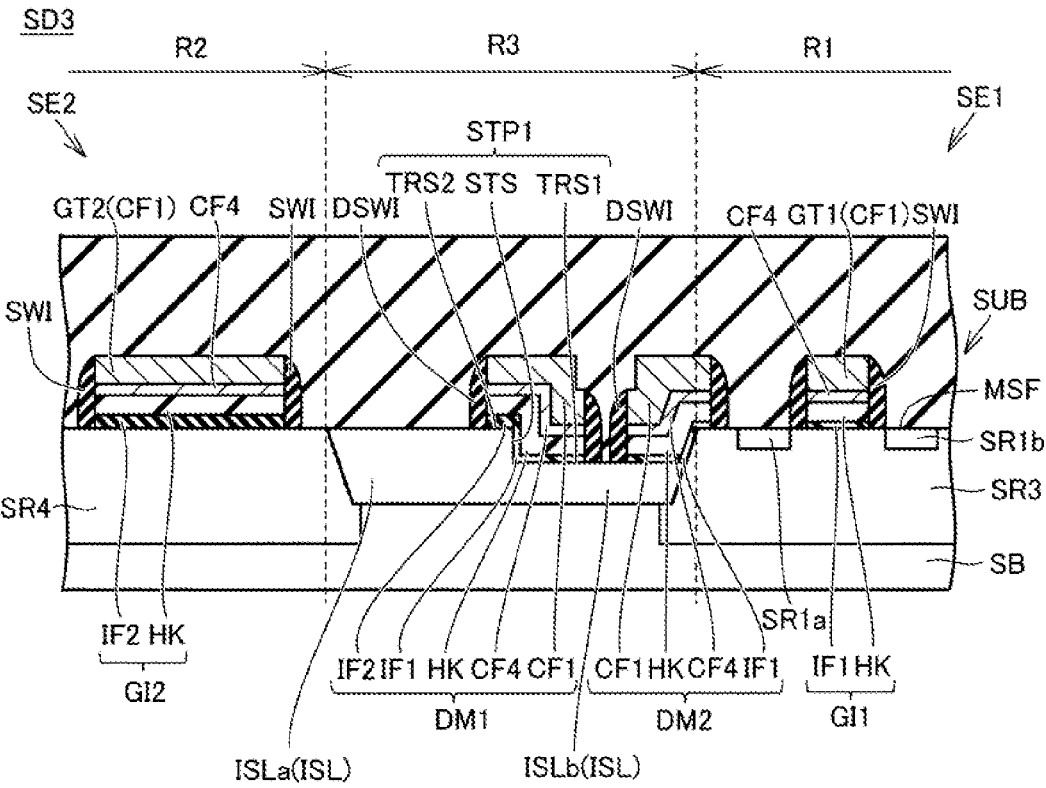
FIG. 20 is a cross-sectional view showing the semiconductor device according to the third embodiment.

As shown in FIG. 20, the semiconductor device SD3 further includes, for example, the fourth conductive film CF4 interposed between the high-dielectric-constant insulating film HK and the first conductive film CF1. The fourth conductive film CF4 includes, for example, titanium nitride (TiN). That is, each of the first element SE1, the second element SE2, the first dummy pattern DM1, and the second dummy pattern DM2 includes a laminated film in which the high-dielectric-constant insulating film HK, the fourth conductive film CF4, and the first conductive film CF1 are laminated in this order from the lower side to the upper side.

The manufacturing method of the semiconductor device SD3 has basically the same configuration as the manufacturing method of the semiconductor device SD2 according to the second embodiment. In the step (S2), the high-dielectric-constant insulating film HK is formed on the first insulating film IF1 or the second insulating film IF2 by, for example, an ALD method or a spin-coating method. Preferably, after the deposition process, an annealing process is performed on the high-dielectric-constant insulating film HK. In the step (S2), the fourth conductive film CF4 may be continuously formed with the first conductive film CF1 after the high-dielectric-constant insulating film HK is formed.

In the semiconductor device SD3, since the sidewall insulating film DSWI covers the high-dielectric-constant insulating film HK exposed from both side surfaces of the dummy pattern DM1, the fine metal particle MFP in the high-dielectric-constant insulating film HK can be prevented from being detached and re-adhered to another region of the semiconductor device SD3 or an unintended location in the manufacturing apparatus.

The semiconductor device SD3 according to the third embodiment may have the same configuration as the semiconductor device SD1 according to the first embodiment, except that the high-dielectric-constant insulating film HK includes a ferroelectric layer made of a material having a dielectric constant higher than a dielectric constant of $Si_3N_4$ and fine metal particles dispersed in the ferroelectric layer.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
a first element disposed in a first region and including a first high-dielectric-constant insulating film;
a second element disposed in a second region; and
an element isolation portion disposed between the first region and the second region, the element isolation portion electrically isolating between the first element and the second element,
wherein a step portion is formed on a surface of the element isolation portion,
wherein the semiconductor device comprises a dummy pattern straddling the step portion,
wherein the dummy pattern includes:
the first high-dielectric-constant insulating film; and
a conductive film covering an upper surface of the first high-dielectric-constant insulating film, wherein the first high-dielectric-constant insulating film is exposed from both side surfaces of the dummy pattern, and wherein the semiconductor device comprises a sidewall insulating film covering the first high-dielectric-constant insulating film exposed from the both side surfaces of the dummy pattern.

2. The semiconductor device according to claim 1, wherein a step height of the step portion is greater than a film thickness of the first high-dielectric-constant insulating film.

3. The semiconductor device according to claim 1, wherein the step portion is configured by:

a step surface;

a first terrace surface located on a side of the first region with respect to the step surface; and a second terrace surface located on a side of the second region with respect to the step surface, wherein each of the step surface, the first terrace surface and the second terrace surface is formed on the element isolation portion.

4. The semiconductor device according to claim 1, wherein the step portion is configured by:

a step surface;

a first terrace surface located on a side of the first region with respect to the step surface; and a second terrace surface located on a side of the second region with respect to the step surface, wherein the first terrace surface and the step surface are formed on a semiconductor region adjacent to the element isolation portion in the first region, and wherein the second terrace surface is formed on the element isolation portion.

5. The semiconductor device according to claim 1, comprising:

a semiconductor substrate having a main surface and a trench disposed on the main surface; and an insulating film filling the trench of the semiconductor substrate, wherein the element isolation portion is configured by the trench and the insulating film.

6. The semiconductor device according to claim 1, wherein the second element is configured so as not to include an insulating film having high-dielectric-constant.

7. The semiconductor device according to claim 1, wherein the second element includes:

a second high-dielectric-constant insulating film; and an insulating film located under the second high-dielectric-constant insulating film.

8. The semiconductor device according to claim 1, wherein a material configuring the first high-dielectric-constant insulating film has a dielectric constant higher than a dielectric constant of silicon nitride.

9. The semiconductor device according to claim 1, wherein the first high-dielectric-constant insulating film includes:

a dielectric layer formed of a material having a dielectric constant higher than a dielectric constant of silicon nitride; and a fine metal particle dispersed in the dielectric layer.

10. The semiconductor device according to claim 9, wherein the dielectric layer includes a first metal, and wherein the fine metal particle is configured by a second metal different from the first metal.

* * * * *